(12) United States Patent
Suzuki et al.

(10) Patent No.: US 11,714,137 B2
(45) Date of Patent: Aug. 1, 2023

(54) ELECTRONIC DEVICE, METHOD FOR DETECTING DETERIORATION OF RECHARGEABLE BATTERY, AND STORAGE MEDIUM

(71) Applicant: CASIO COMPUTER CO., LTD., Tokyo (JP)

(72) Inventors: Hideo Suzuki, Ome (JP); Tsuyoshi Minami, Musashimurayama (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 17/466,010

(22) Filed: Sep. 3, 2021

(65) Prior Publication Data
US 2022/0075001 A1   Mar. 10, 2022

(30) Foreign Application Priority Data

Sep. 4, 2020 (JP) .................................. 2020-148640

(51) Int. Cl.
| | |
|---|---|
| *G01R 31/392* | (2019.01) |
| *G01R 31/374* | (2019.01) |
| *G01R 31/3835* | (2019.01) |
| *H02J 7/00* | (2006.01) |

(52) U.S. Cl.
CPC ......... *G01R 31/392* (2019.01); *G01R 31/374* (2019.01); *G01R 31/3835* (2019.01); *H02J 7/005* (2020.01)

(58) Field of Classification Search
None
See application file for complete search history.

(56) References Cited

U.S. PATENT DOCUMENTS

2013/0038333 A1*  2/2013  Harada ................. H01M 10/48
                                                               324/431

FOREIGN PATENT DOCUMENTS

| CN | 101639522 A | 2/2010 |
|---|---|---|
| CN | 103837835 A | 6/2014 |
| JP | 2001056362 A | 2/2001 |
| JP | 2007-178333 A | 7/2007 |

OTHER PUBLICATIONS

Notice of Reasons for Refusal dated Dec. 20, 2022 received in Japanese Patent Application No. JP 2020-148640.
First Office Action dated Apr. 23, 2023 received in Chinese Patent Application No. CN 202111020319.7.

* cited by examiner

*Primary Examiner* — Jas A Sanghera
(74) *Attorney, Agent, or Firm* — Scully, Scott, Murphy & Presser, P.C.

(57) ABSTRACT

An electronic device includes: a first processor; a load that operates with power supplied by a rechargeable battery; and a first sensor that obtains information on an output voltage of the rechargeable battery. The first processor determines whether the rechargeable battery is in a low usage state with regard to power supply by the rechargeable battery. Based on the information obtained by the first sensor, the first processor determines a degree of decrease in the output voltage over a period of time during which the rechargeable battery is determined to be in the low usage state. Based on the determined degree of decrease, the first processor detects a deterioration of the rechargeable battery.

17 Claims, 4 Drawing Sheets

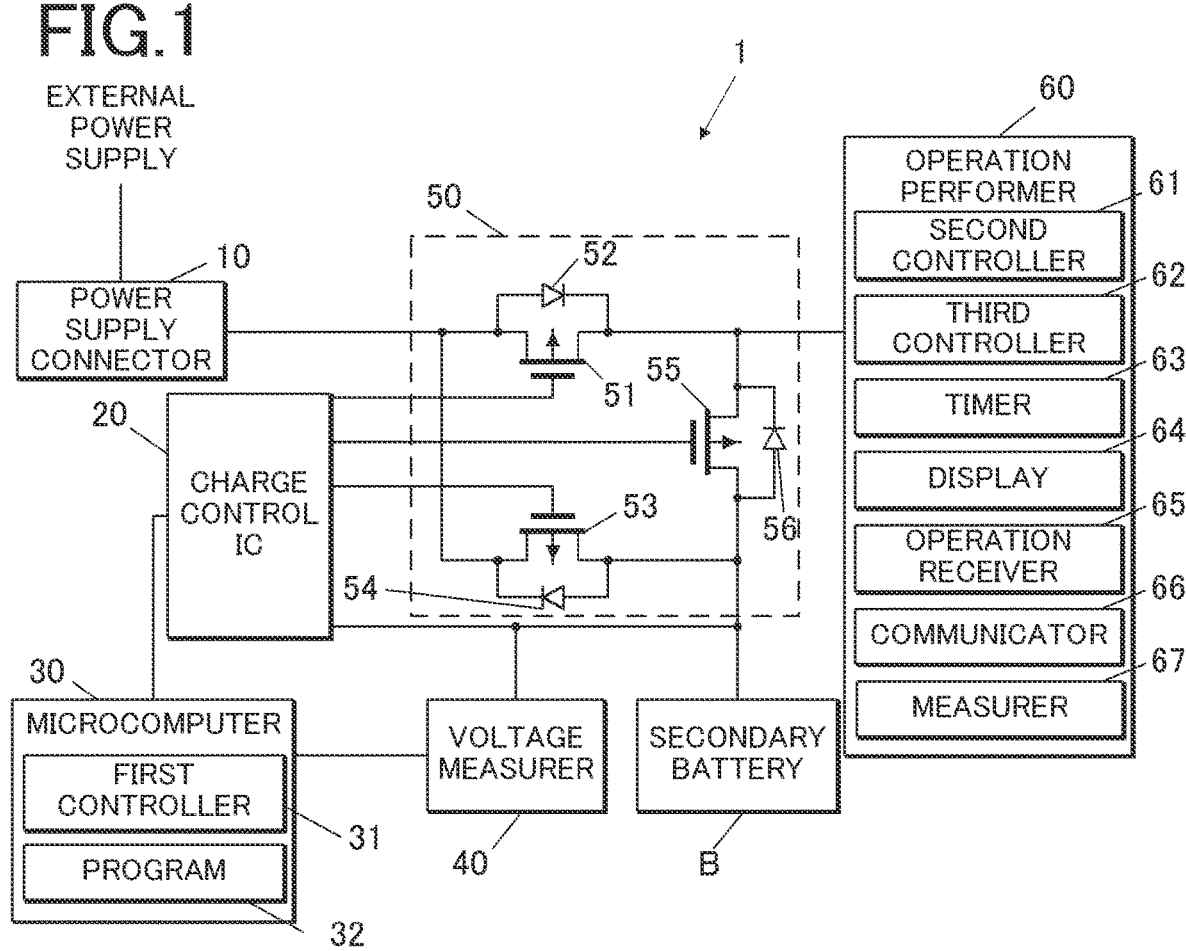

ELECTRONIC DEVICE, METHOD FOR DETECTING DETERIORATION OF RECHARGEABLE BATTERY, AND STORAGE MEDIUM

CROSS-REFERENCE TO RELATED APPLICATIONS

This application is based upon and claims the benefit of priority under 35 USC 119 of Japanese Patent Application No. 2020-148640 filed on Sep. 4, 2020, the entire disclosure of which, including the description, claims, drawings, and abstract, is incorporated herein by reference in its entirety.

BACKGROUND OF THE INVENTION

1. Field of the Invention

The present disclosure relates to an electronic device, a method for detecting deterioration of a rechargeable battery, and a storage medium.

2. Description of the Related Art

A known electronic device includes a rechargeable battery. By charging the rechargeable battery, the electronic device can be used for a long time. When the electronic device is connected to a power supply wire that sends power to the rechargeable battery to charge the rechargeable battery, the electronic device is also operable with power sent via the power supply wire.

The rechargeable battery deteriorates as it repeats charge and discharge many times. As a result, performance of the rechargeable battery decreases. JP2007-178333A discloses a technique for determining a decrease in performance of a rechargeable battery on the basis of a pattern of voltage changes when the charged rechargeable battery is opened.

BRIEF SUMMARY OF THE INVENTION

According to an aspect of the present invention, there is provided an electronic device including: a first processor; a load that operates with power supplied by a rechargeable battery; and a first sensor that obtains information on an output voltage of the rechargeable battery, wherein the first processor: determines whether the rechargeable battery is in a low usage state with regard to power supply by the rechargeable battery; based on the information obtained by the first sensor, determines a degree of decrease in the output voltage over a period of time during which the rechargeable battery is determined to be in the low usage state; and based on the determined degree of decrease, detects a deterioration of the rechargeable battery.

According to another aspect of the present invention, there is provided a method for detecting deterioration of a rechargeable battery of an electronic device that includes: a load that operates with power supplied by the rechargeable battery; and a first sensor that obtains information on an output voltage of the rechargeable battery, the method including: determining whether the rechargeable battery is in a low usage state with regard to power supply by the rechargeable battery; determining a degree of decrease in the output voltage over a period of time during which the rechargeable battery is determined to be in the low usage state, based on the information obtained by the first sensor; and detecting a deterioration of the rechargeable battery, based on the determined degree of decrease.

According to another aspect of the present invention, there is provided a non-transitory computer-readable storage medium storing a program for a computer of an electronic device that includes: a load that operates with power supplied by a rechargeable battery; and a first sensor that obtains information on an output voltage by the rechargeable battery, the program causing the computer to: determine whether the rechargeable battery is in a low usage state with regard to power supply by the rechargeable battery; determine a degree of decrease in the output voltage over a period of time during which the rechargeable battery is determined to be in the low usage state, based on the information obtained by the first sensor; and detect a deterioration of the rechargeable battery, based on the determined degree of decrease.

BRIEF DESCRIPTION OF THE SEVERAL VIEWS OF DRAWINGS

The accompanying drawings are not intended as a definition of the limits of the invention but illustrate embodiments of the invention, and together with the general description given above and the detailed description of the embodiments given below, serve to explain the principles of the invention, wherein:

FIG. 1 is a block diagram showing functional components of an electronic device;

DETAILED DESCRIPTION OF THE INVENTION

Figure 2A:
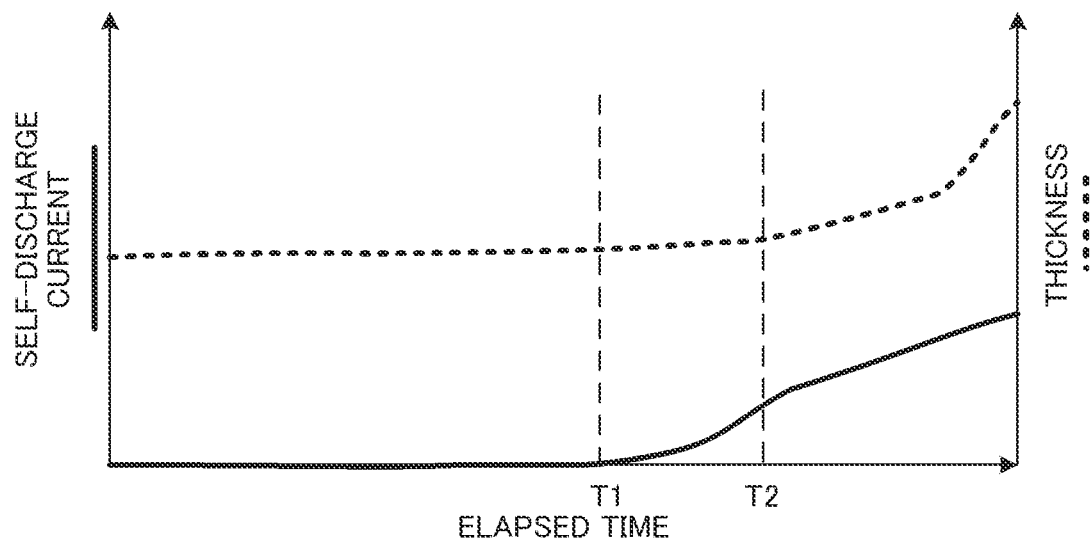
FIG. 2A shows chronological changes of the state of a rechargeable battery as it deteriorates.

Hereinafter, one or more embodiments of the present invention will be described with reference to the drawings. However, the present invention is not limited to the disclosed embodiments.

FIG. 1 is a block diagram showing functional components of an electronic device 1 in an embodiment.

The electronic device 1 is not limited to a specific device. The electronic device 1 may be, for example, a portable device, such as a smart watch (wearable terminal) wearable on the arm of a user. The electronic device 1 includes: a power supply connector 10; a charge control integrated circuit (IC) 20; a microcomputer 30 (computer); a voltage measurer 40 (first sensor); a power supply circuit 50; and an operation performer 60 (load).

The electronic device 1 also has a rechargeable battery B. The rechargeable battery B may be a repairable and replaceable battery fixed to the electronic device 1 as a component of the electronic device 1. Alternatively, the rechargeable battery B may be a battery that is easily detachable by a user. The rechargeable battery B is, for example, a lithium-ion battery. The rechargeable battery B supplies power to the operation performer 60, the charge control IC 20, and the microcomputer 30 so that they can operate.

The power supply connector 10 is connected to a wire(s) from an external power supply. The power supply connector 10 includes an input terminal for inputting predetermined DC voltage power for operation and charging. The DC voltage power is generated by, for example, converting commercial AC power with a voltage transformer (adopter) provided in the middle of the wire. Alternatively, the power supply connector 10 may include a universal serial bus (USB) terminal for receiving power via the USB terminal.

The charge control IC 20 performs switching control between supplying power to the operation performer 60 and charge/discharge of the rechargeable battery B. The charge control IC 20 switches opening and closing of (i) a current channel from the external power supply to the rechargeable battery B, (ii) a current channel from the rechargeable battery B to the operation performer 60, and (iii) a current channel that directly connects the external power supply and the operation performer 60. The charge control IC 20 performs the switching on the basis of the connection state of the power supply connector 10 to the external power supply and information on the measurement of the voltage measurer 40.

The microcomputer 30 controls operation of the charge control IC 20 and the voltage measurer 40. The microcomputer 30 includes: a first controller 31 (first processor, determination unit, detection unit) including a hardware processor for performing control operation; and a nonvolatile memory, such as a flash memory or a read-only memory (ROM). The nonvolatile memory stores a program(s) 32. In accordance with the program 32, the first controller 31 controls switching of the current channels and detects the deterioration of the rechargeable battery B, which is described later.

The charge control IC 20 may also be included as part of the first processor in this embodiment.

The voltage measurer 40 obtains information on output voltage of the rechargeable battery B by measuring the output voltage and outputs the information to the microcomputer 30.

The power supply circuit 50 is an electric circuit that electrically connects the power supply connector 10 (i.e., external power supply), the rechargeable battery B, and the operation performer 60. Between the power supply connector 10 and the operation performer 60, a transistor 51 and a feedback diode 52 are connected. Between the power supply connector 10 and the rechargeable battery B, a transistor 53 and a feedback diode 54 are connected. Between the rechargeable battery B and the operation performer 60, a transistor 55 and a feedback diode 56 are connected. The transistors 51, 53, 55 function as analog switches that are switched on/off to turn on/shut off electricity by the charge control IC 20.

The operation performer 60 operates with power input by the power supply connector 10 while consuming power required for various functional operations. The operation performer 60 includes: a second controller 61 (second processor); a third controller 62 (third processor); a timer 63; a display 64; an operation receiver 65; a communicator 66; and a measurer 67 (second sensor), for example.

The second controller 61 centrally controls operations of components of the operation performer 60. The second controller 61 includes a hardware processor, such as a central processing unit (CPU), and a random access memory (RAM), for example. The second controller 61 executes various arithmetic processes to perform basic operations and various application programs for the operation performer 60.

The third controller 62 consumes less power than the second controller 61. The third controller 62 controls timekeeping operation by the timer 63 and limited display of current date and/or time by the display 64. When the electronic device 1 is in a clock operation mode in which the electronic device 1 only displays current date and time and does not execute application programs, the electronic device 1 operates in a power-saving mode. In the power-saving mode, the electronic device 1 operates with the third controller 62 while the second controller 61 is deactivated. When the third controller 62 detects an input operation to the operation receiver 65, the third controller 62 activates the second controller 61, so that the electronic device 1 returns to a normal operation mode.

The timer 63 keeps current date and time. The timer 63 may include a real time clock (RTC), for example. When the second controller 61 is active, the timer 63 can keep the date and time accurately on the basis of clock signals for operation counted by the CPU of the second controller 61.

The display 64 displays various contents. The display 64 includes, for example, a liquid crystal display (LCD) for displaying characters, symbols, images, and so forth. The LCD is capable of full-color display under the control of the second controller 61. When the third controller 62 causes the display 64 to display current date and time, the display 64 may switch to subdue-color or monochrome display, for example.

The operation receiver 65 receives input operations from outside (e.g., input by the user). The operation receiver 65 includes, for example, a touchscreen laid on the LCD and a pressing button switch(es) provided on the lateral surface of the electronic device 1 with respect to the display surface. When an input operation is received, an input signal that indicates the received content is output to the second controller 61 and/or the third controller 62.

The communicator 66 performs communication operations under the control of the second controller 61. The communication operations are near-field wireless communication with other external devices over Bluetooth (registered trademark) or Wi-Fi, for example.

The measurer 67 measures, for example, the amount of movement of the user (electronic device 1), the direction (geomagnetic field), pulses of the user, temperature and atmospheric pressure of the surroundings, and so forth. The measurer 67 is capable of performing measuring operation when the second controller 61 is active. The measurer 67 outputs the measurement result to the second controller 61 at appropriate frequency. When the result of measuring temperature is used for evaluating the deterioration degree of the rechargeable battery B, the measurer 67 may measure temperature at low frequency when the second controller 61 is inactive. In the case, the result of measuring temperature may be output to the third controller 62 or directly to the microcomputer 30.

Next, charge-discharge operation of the rechargeable battery B in the electronic device 1 in this embodiment is described. The rechargeable battery B is charged as needed by receiving power of the external power supply. The rechargeable battery B supplies the accumulated power to the operation performer 60 so that the operation performer 60 can operate. When the power supply connector 10 is not connected to the external power supply, the charge control IC 20 turns on the transistor 55 so that the rechargeable battery B can supply power to the operation performer 60. Herein, the transistors 51, 53 may be turned off.

When the power supply connector 10 is connected to the external power supply, the charge control IC 20 turns on the transistor 53 so that the external power supply can charge the rechargeable battery B. In the case, the transistor 51 is also turned on so that the external power supply can supply power directly to the operation performer 60.

When the voltage of the rechargeable battery B reaches a full-charge voltage and the rechargeable battery is fully charged, the transistor 53 is turned off. When the power supply connector 10 is kept connected to the external power supply after the rechargeable battery B is fully charged, the transistor 51 may be kept turned on. As the rechargeable battery B self-discharges power, the voltage of the rechargeable battery B is lower than the voltage of power input by the external power supply via the power supply connector 10. Accordingly, the second battery B does not supply power to the operation performer 60 regardless of the state of the transistor 55.

When the rechargeable battery B does not supply power to the operation performer 60, the rechargeable battery B supplies power that corresponds to (i) current for the charge control IC 20 and the microcomputer 30 to perform normal operations and (ii) micro current for the voltage measurer 40 to measure voltage. On the other hand, self-discharge occurs in the rechargeable battery B depending on the characteristics of the battery. The self-discharge is normally minute but increases as deterioration of the rechargeable battery B proceeds.

FIG. 2A shows chronological changes of in self-discharge current and thickness of the rechargeable battery B as the rechargeable battery B deteriorates. As used hours of the rechargeable battery B increase, the rechargeable battery B, which is a lithium-ion battery, generates gas and expands. As the expansion of the rechargeable battery B proceeds, the rechargeable battery B may affect other components (e.g., press other components). Such rechargeable battery B needs replacement. The self-discharge current starts increasing conspicuously at the timing T1 earlier than the timing T2 at which the rechargeable battery B starts expanding. Increase in self-discharge current leads to a longer charging time and a shorter period of time during which the charged rechargeable battery B is continuously usable.

The electronic device 1 in this embodiment detects deterioration of the rechargeable battery B by measuring changes in the voltage decrease speed (rate) of the rechargeable battery B, which is caused by increased self-discharge current. Naturally, the voltage decrease of a battery depends on how much the battery is used. The electronic device 1 measures voltage decrease of the rechargeable battery B when the rechargeable battery B is in a low usage state. In the low usage state, the rechargeable battery B is not actively used with respect to the operation of the operation performer 60. The low-usage state includes the state after a set period of time elapses from (i) the start of the clock operation mode in which the power consumption is sufficiently small (the power consumption becomes equal to or less than a certain reference level) because the second controller 61 stops operation or (ii) the start of the situation in which the power supply connector 10 is kept connected to the external power supply and the rechargeable battery B is not on charge (i.e., the rechargeable battery B is not supplying power to the operation performer 60). The reference level of the power consumption may not be quantitatively fixed. The reference level may be set on the basis of operation modes (e.g., clock operation mode). The reference level may also be changed according to the situation. The set time may be set appropriately in consideration of (i) time required for the user to immediately cancel an unintended mode change and (ii) time required for the rechargeable battery B to stabilize its voltage after the initial voltage decrease due to a mode change operation. The low usage state herein does not refer to the state in which the rechargeable battery B is completely electrically disconnected from the electronic device 1 and released.

In the clock operation mode, power of the rechargeable battery B is consumed for the operation of the timer 63 and the limited operation of the third controller 62 and the display 64. The power consumption is therefore substantially constant and small. The latter case (the power supply connector 10 is kept connected to the external power supply and the rechargeable battery B is not on charge) does not depend on the operation state of the operation performer 60. It is less likely that the user uses the wearable terminal on the body (arm) while keeping the terminal connected to the charging cable from the external power supply. The electronic device 1 is therefore more likely to go into the clock operation mode until being fully charged. In most cases, the user may not remove the charging cable from the power supply connector 10 immediately after charging finishes.

Figure 2B:
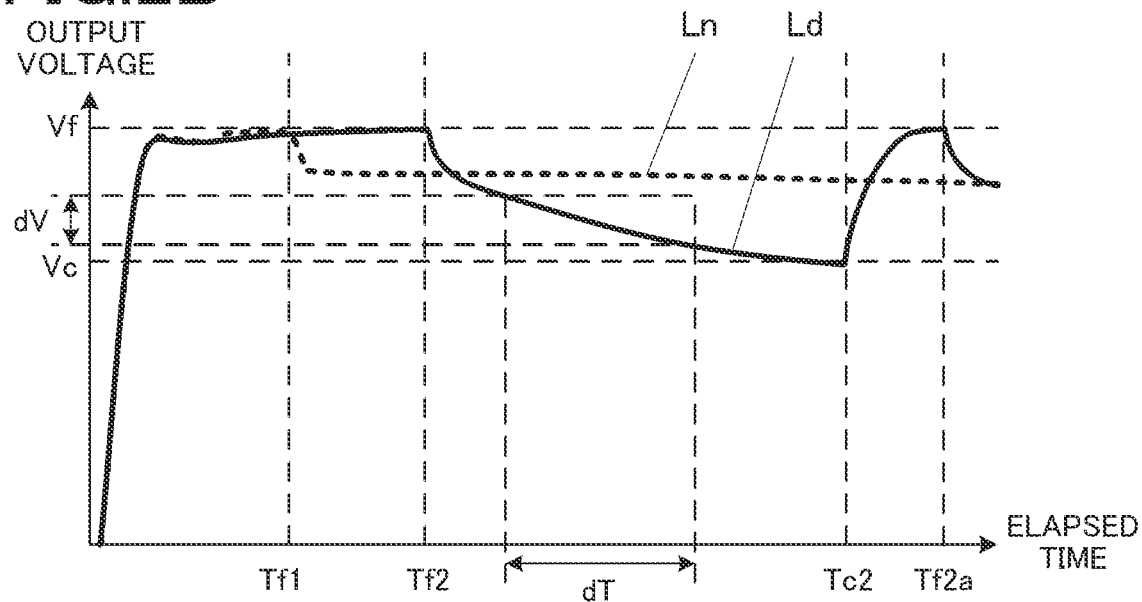
FIG. 2B shows changes in output voltage of the rechargeable battery.

FIG. 2B shows an example of chronological changes in the output voltage of the rechargeable battery B when the power supply connector 10 is connected to the external power supply. The dotted line Ln shows chronological changes of the output voltage when the rechargeable battery B is in a normal state. In the normal state, deterioration of the rechargeable battery B has not proceeded much (deterioration is small). The solid line Ld shows chronological changes of the output voltage when deterioration of the rechargeable battery B has proceeded (deterioration is large).

As shown by Ln indicating the normal state, after reaching the full-charge voltage Vf at the timing Tf1 and charging finishes, the output voltage in the low usage state decreases quite slowly after the first drop. On the other hand, the output voltage of the deteriorating rechargeable battery B decreases quickly as the self-discharge increases after the timing Tf2 at which the charging finishes and first drop of the output voltage occurs. The output voltage reaches a recharge voltage Vc at the timing Tc2. At Tc2, the charge control IC 20 turns on the transistor 53 so that the rechargeable battery B is recharged until its output voltage again reaches the full-charge voltage Vf at the timing Tf2a.

In the example case herein, charging of the rechargeable battery B shifts from constant current charging to constant voltage charging while the rechargeable battery B is on charge, and time required for constant voltage charging changes according to the deterioration degree of the rechargeable battery B. The charging method, however, is not specifically limited.

As described above, the deterioration degree of the rechargeable battery B is determined/detected while the power supply connector 10 is connected to the external power supply and particularly after the rechargeable battery B finishes charging. The detection is done on the basis of the voltage decrease rate (degree of decrease in output voltage) between the full-charge voltage Vf and the recharge voltage Vc. Herein, the voltage decrease rate is determined by the correlation between the voltage decrease width dV and the time dT required for the voltage to decrease by the voltage decrease width dV. The voltage decrease rate may be determined by measuring the required time dT for a set decrease width dV (time elapsed until the voltage decreases by the set decrease width dV). Alternatively, the voltage decrease rate may be determined by measuring the decrease width dV over a set required time dT.

The voltage decrease is not linear with respect to the elapsed time. The gradient of voltage decrease may slightly change depending on the output voltage range for measuring the decrease width dV. There may be a case where a reference voltage decrease rate is fixed beforehand with respect to a combination of (i) the output voltage at the start of measuring the decrease width dV or the median of the output voltage in the decrease width dV and (ii) the absolute value of the decrease width dV, for example. When either the decrease width dV or the required time dT is fixed in the case, a reference time dT0/reference decrease width dV0 may be set instead of the reference voltage decrease rate. As the gradient in voltage also depends on temperature, the temperature of the electronic device 1 may be included in the conditions for setting the reference voltage decrease rate. More specifically, the reference voltage decrease rate may be set on the basis of the temperature measured by the measurer 67.

The wider/longer the voltage decrease width dV/required time dT is, the easier it is to detect the deterioration degree. The maximum voltage decrease width dV may be a difference between the full-charge voltage Vf and the recharge voltage Vc. In the case, the time interval between recharges is compared with a reference time. On the other hand, the wider/longer the voltage decrease width dV/required time dT is, the more likely it is that the low usage state ends during detection of the deterioration degree. The voltage decrease width dV and the required time dT may therefore be set to values smaller than their respective maximum values. Alternatively, the voltage decrease width dV and the required time dT may be variable depending on the situation. Further, the recharge voltage Vc may be changed according of the usage state of the electronic device 1 and/or the temperature condition. The voltage decrease width dV and the required time dT may be changed according to the recharge voltage Vc.

When the low usage state ends during detection of the deterioration state, the voltage decrease rate may be determined on the basis of the voltage decrease width dV and the required time dT until the end of the low usage state. Alternatively, detection of the voltage decrease rate and detection of the deterioration state may be stopped without exception or depending on the situation. Detection of the deterioration state may start when the rechargeable battery B is in the low usage state and the low usage state is predicted to continue for around the required time dT. For example, conditions for starting detection of the deterioration state may include a condition on time (e.g., night time only). For another example, the history of occurrences of the power-saving mode by time windows may be created, and detection of the deterioration state may not be started in the time window in which the power-saving mode occurs at a frequency equal to or less than a reference frequency.

The output by the rechargeable battery B when the power supply connector 10 is not connected to the external power supply is greater than the output when the power supply connector 10 is connected to the external power supply by the timekeeping operation and display operation of the operation performer 60. As a result, the voltage decrease rate becomes correspondingly greater. When the electronic device 1 has a resident application program that consumes a small amount of power and that is active in the low usage state, the power consumption of the electronic device 1 may increase by the power consumption of the program. Determination of the deterioration state may be made regardless of the connection to the external power supply. In the case, the determination may be made on the basis of a uniform reference or may be made on the basis of different reference voltage decrease rates or a variable reference voltage decrease rate (reference for detection) depending on the state of the electronic device 1. The state of the electronic device 1 is, for example, the connection state to the external power supply and the type of the active application program.

When the power supply connector 10 is not connected to the external power supply, the rechargeable battery B is not recharged even when its output voltage is equal to or less than the recharge voltage Vc. The voltage decrease rate can therefore be measured when the output voltage is equal to or less than the recharge voltage Vc. The reference voltage decrease rate may be set for the output voltage range that is below the recharge voltage Vc.

Figure 3:
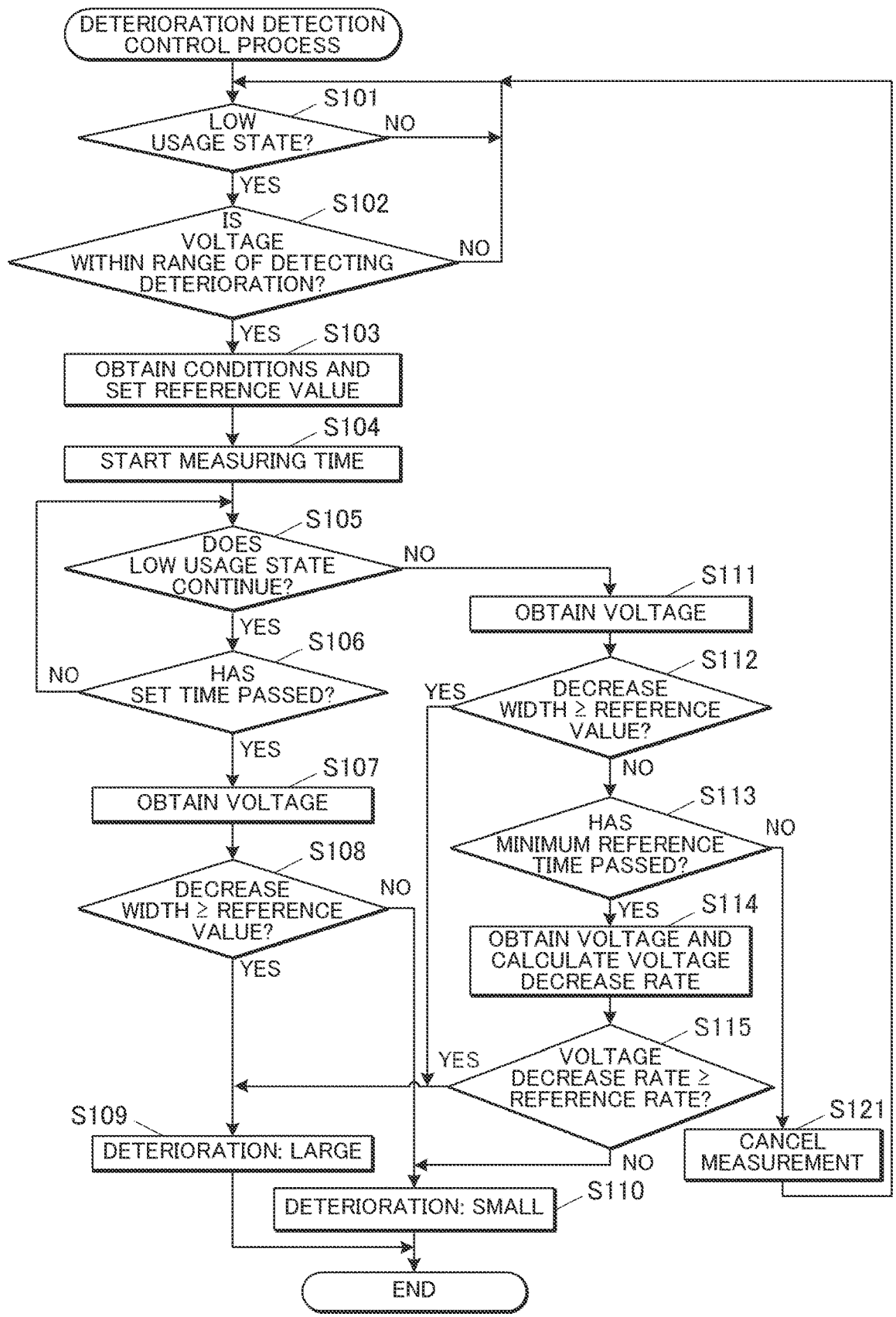
FIG. 3 is a flowchart of a control procedure of a deterioration detection control process.

FIG. 3 is a flowchart of the control procedure of the deterioration detection control process in this embodiment. The process is performed by the first controller 31 of the microcomputer 30 in the electronic device 1.

The deterioration detection control process is started at a predetermined time everyday or at a predetermined time of every predetermined number of days passed after the last deterioration detection (e.g., before or after the timing in the evening when the user ends using the electronic device 1 and connects the electronic device 1 to the external power supply).

When the deterioration detection control process is started, the first controller 31 determines whether the rechargeable battery B of the electronic device 1 is in the low usage state (Step S101; operation as the determination unit, determination step, determination means). More specifically, the first controller 31 determines whether (i) the electronic device 1 is connected to the external power supply and the rechargeable battery B is not on charge or (ii) the electronic device 1 is in the clock operation mode. When determining that the rechargeable battery B is not in the low usage state (Step S101: NO), the first controller 31 repeats Step S101. The process of Step S101 may be performed at appropriate intervals.

When determining that the rechargeable battery B is in the low usage state (Step S101: YES), the first controller 31 determines whether the output voltage of the rechargeable battery B is within the range for starting deterioration detection (Step S102). As described above, the output voltage range (a certain voltage) for starting deterioration detection may not be fixed as long as the output voltage is measurable. For example, the output voltage range may be set widely (e.g., equal to or greater than the recharge voltage Vc). For another example, the output voltage range may be limited to: a certain voltage after the charging of the rechargeable battery B finished at the full-charge voltage Vf and after the output voltage firstly drops; or around a certain voltage with respect to measurement accuracy or measurement intervals. When determining that the output voltage is not within the range of starting deterioration detection (Step S102: NO), the first controller 31 returns to Step S101.

When determining that the output voltage is within the range of starting deterioration detection (Step S102: YES), the first controller 31 obtains conditions as needed, such as current temperature and the connection state of the power supply connector 10 to the external power supply, and sets a reference value of the voltage decrease width (Step S103). The reference value is, for example, the reference decrease width dV0 from the current voltage over the required time dT. The first controller 31 starts measuring elapsed time (Step S104).

The first controller 31 determines whether the low usage state continues (Step S105). When determining that the low usage state continues (Step S105: YES), the first controller 31 determines whether the set required time dT has elapsed (Step S106). When determining that the set required time dT has not elapsed yet (Step S106: NO), the first controller 31 returns to Step S105.

When determining that the set required time dT has elapsed (Step S106: YES), the first controller 31 obtains a voltage value from the voltage measurer 40 (Step S107). The first controller 31 calculates (determines) the voltage decrease width between the obtained voltage value and the voltage value when the measurement starts, and determines whether or not the determined decrease width is equal to or greater than the reference value (reference decrease width dV0) (Step S108). When determining that the decrease width is equal to or greater than the reference value (Step S108: YES), the first controller 31 determines that the deterioration of the rechargeable battery B is large (Step S109). The first controller 31 then ends the deterioration detection control process. When determining that the decrease width is not equal to or greater than the reference value (i.e., less than the reference value) (Step S108: NO), the first controller 31 determines that the deterioration of the rechargeable battery B is small (Step S110). The first controller 31 then ends the deterioration detection control process. The determined deterioration degree may be sent to the second controller 61 when the second controller 61 is active and may be appropriately displayed on the display 64 or notified to the user through various notification actions.

When determining that the low usage state has not continued (i.e., the low usage state has ended) (Step S105: NO), the first controller 31 obtains a voltage value from the voltage measurer 40 (Step S111). The first controller 31 calculates (determines) the voltage decrease width between the obtained voltage value and the voltage value when the measurement starts, and determines whether the voltage decrease width is equal to or greater than the reference value (Step S112). When determining that the voltage decrease width is equal to or greater than the reference value (Step S112: YES), the first controller 31 proceeds to Step S109.

When determining that the voltage decrease width is not equal to or greater than the reference value (Step S112: NO), the first controller 31 determines whether a minimum reference time required for detecting deterioration has elapsed since the start of the measurement (Step S113). The minimum reference time is not limited to a specific period of time but may be, for example, a certain proportion of the required time dT (e.g., 60%). When determining that the minimum reference time has not elapsed yet (Step S113: NO), the first controller 31 cancels the measurement result (Step S121) and returns to Step S101.

When determining that the minimum reference time has elapsed (Step S113: YES), the first controller 31 obtains the current output voltage and calculates the voltage decrease rate on the basis of the current voltage decrease width and the elapsed time (Step S114). The first controller 31 determines whether or not the voltage decrease rate is equal to or greater than the reference voltage decrease rate (Step S115). The reference voltage decrease rate corresponds to the set required time dT and/or the reference decrease width. When determining that the voltage decrease rate is equal to or greater than the reference voltage decrease rate (Step S115: YES), the first controller 31 proceeds to Step S109. When determining that the voltage decrease rate is not equal to or greater than the reference voltage decrease rate (the voltage decrease rate is less than the reference voltage decrease rate) (Step S115: NO), the first controller 31 proceeds to Step S110. The first controller 31 then ends the deterioration detection control process.

Although the first controller 31 only determines whether the deterioration is great or small in the above process, the first controller 31 may determine the deterioration degree in three or more stages (multi-stages).

Among the above-described steps, the processes of Steps S108 to S110, S112, S114, S115 and the like are performed by the first controller 31 as a detection unit, constitute the detection step in the deterioration detection method, and constitute a detection means of the program 32.

Figure 4:
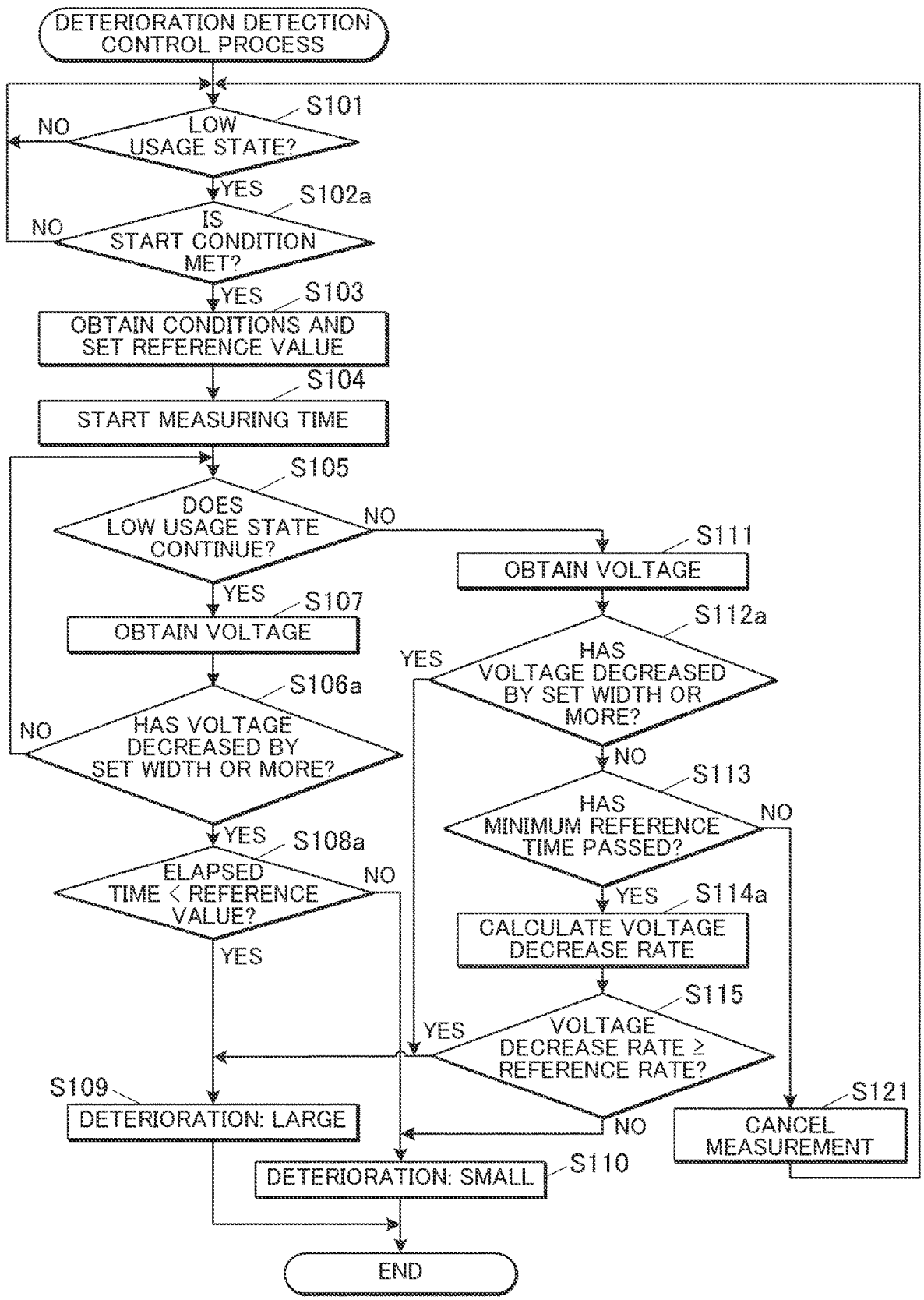
FIG. 4 is a flowchart of another example of the deterioration detection control process.

FIG. 4 is a flowchart of another example of the deterioration detection control process. The modification is different from the deterioration detection control process shown in FIG. 3 in that (i) the processes of Steps S102, S106, S108, S112, and S114 are replaced with Steps S102a, S106a, S108a, S112a, and S114a, respectively, and (ii) Step S107 comes before Step S108a. The other steps in the modification are the same as the deterioration detection control process in FIG. 3. The same steps are indicated by the same reference numerals, and the detailed description thereof is omitted.

In the modification of the deterioration detection control process, the deterioration of the rechargeable battery B is determined by measuring the time required for the voltage to decrease by a fixed voltage decrease width dV.

When determining that the rechargeable battery B is in the low usage state (Step S101: YES), the first controller 31 determines whether a condition(s) to start deterioration detection is met (Step S102a). The condition to start deterioration detection may include, in addition to or instead of the voltage range described above, a level of possibility that the low usage state continues for the reference time dT0 or longer. The possibility is based on information for predicting continuation of the low usage state. When determining that the condition to start deterioration detection is met (Step S102a: YES), the first controller 31 proceeds to Step S103. When determining that the condition to start detecting deterioration is not met (Step S102a: NO), the first controller 31 returns to Step S101.

When determining "YES" in Step S105 (determining that the low usage state continues), the first controller 31 obtains a voltage value from the voltage measurer 40 (Step S107). The first controller 31 determines whether the output voltage has decreased from the initial voltage by the set decrease width dV or more (Step S106a). When determining that the output voltage has not decreased by the set decrease width dV or more yet (Step S106a: NO), the first controller 31 returns to Step S105.

When determining that the output voltage has decreased by the set decrease width dV or more (Step S106a: YES), the first controller 31 determines whether the elapsed time until the current point is less than a reference required time (reference time dT0) (Step S108a). When determining that the elapsed time is less than the reference time dT0 (Step S108a: YES), the first controller 31 proceeds to Step S109. When determining that the elapsed time is not less than the reference time dT0 (i.e., the elapsed time is equal to or greater than the reference time dT0) (Step S109: NO), the first controller 31 proceeds to Step S110.

After obtaining the voltage value in Step S111, the first controller 31 determines whether or not the output voltage has decreased by the set decrease width dV or more (Step S112a). When determining that the output voltage has decreased by the set decrease width dV or more (Step S112a: YES), the first controller 31 proceeds to Step S109.

When determining that the output voltage has not decreased by the decrease width dV or more (Step S112a: NO), the first controller 31 proceeds to Step S113. When determining that the minimum reference time has passed (Step S113: YES), the first controller 31 calculates the voltage decrease rate (Step S114a). The first controller 31 then proceeds to Step S115.

In the modification, when the first controller 31 repeats determining that the voltage has not decreased by the set decrease width dV or more for a long time in Step S106*a*, the first controller 31 may determine that the rechargeable battery B clearly does not deteriorate and proceed to Step S110.

As described above, the electronic device 1 in this embodiment includes the operation performer 60 that operates with the power supplied by the rechargeable battery B, the voltage measurer 40 that obtains information on the voltage output by the rechargeable battery B, and the first controller 31 of the microcomputer 30. The first controller 31 determines, as the determination unit, whether the rechargeable battery B is in the low usage state with regard to power supply by the rechargeable battery; based on the information obtained from the voltage measurer 40, determines, as the detection unit, the degree of decrease in the output voltage over a period of time during which the rechargeable battery B is determined to be in the low usage state; and based on the determined degree of decrease, detects the deterioration state of the rechargeable battery B. As described above, the electronic device 1 can detect the deterioration degree of the rechargeable battery B easily and appropriately while allowing the user to use the electronic device 1. For example, the user does not have to remove the rechargeable battery B from the electronic device 1 while using the electronic device 1. The use of the electronic device 1 is not interrupted. The electronic device 1 can urge the user to deal with deterioration of the rechargeable battery B, such as to replace the rechargeable battery B, before the performance of the rechargeable battery B decreases considerably or any trouble occurs.

The electronic device 1 further includes: the power supply circuit 50 that electrically connects the rechargeable battery B to the operation performer 60; and the charge control IC 20 that controls charging of the rechargeable battery B when the power supply circuit 50 is connected to the external power supply. The charge control IC 20 sends the power supplied by the external power supply to the operation performer 60 while the power supply circuit 50 is connected to the external power supply. The first controller 31 as the determination unit determines that the rechargeable battery B is in the low usage state when the rechargeable battery B is not on charge and the operation performer 60 is operating with the power supplied by the external power supply. It is often the case that after returning indoors, the user connects the electronic device 1, in particular a portable terminal, to the commercial power supply and leaves it as it is. The electronic device 1 can use such a period of time except the charging time to appropriately measure the self-discharge and to detect the deterioration degree of the rechargeable battery B.

Further, the first controller 31 as the detection unit starts detecting the degree of decrease in voltage caused by self-discharge when the power supply circuit 50 is kept connected to the external power supply after the rechargeable battery B is fully charged. As the voltage of the rechargeable battery B is high and close to the full-charge voltage Vf right after charging, self-discharge can be detected more easily and stably. It is often the case that a portable terminal is charged at the end of its use on the day and left as it is after being fully charged. As the electronic device 1 is kept in the stable low usage state, the electronic terminal 1 can accurately measure the degree of decrease in voltage output by the rechargeable battery B. Accordingly, the electronic device 1 can detect the deterioration degree of the rechargeable battery B easily and appropriately without much work.

Further, the first controller 31 as the detection unit starts detecting the degree of decrease in the output voltage when the output voltage of the rechargeable battery B reaches a predetermined start voltage in the low usage state. When the output voltage is too high or too low, the voltage decrease may not be measured appropriately. The first controller 31 measures the degree of decrease in the output voltage when the output voltage is within a normal range, in which the voltage is not too high or too low. Accordingly, the electronic device 1 can detect the deterioration degree stably and appropriately at desired accuracy without narrowing opportunities for measurement.

Further, the first controller 31 as the detection unit detects the degree of decrease in the output voltage, based on the decrease width of the output voltage over the reference time dT0 or the time until the output voltage decreases by the reference decrease width dV0. The electronic device 1 thus fixes either the decrease width or the time, which are required for determining the degree of decrease in the output voltage, and measures the other thereof, so that the process can be done easily. In measuring the decrease width of the output voltage over the reference time dT0, the electronic device 1 only needs to measure voltages at the first and end of the reference time dT0. This can reduce power consumption for measuring the voltage.

Further, the first controller 31 as the determination unit determines that the rechargeable battery B is in the low usage state when a set time elapses since consumption of power of the the rechargeable battery B by the operation performer 60 becomes equal to or less than a reference level. When the first controller 31 determines that the rechargeable battery B is in the low usage state immediately after the power consumption becomes equal to or less than the reference level, the electronic device 1 may unnecessarily start detecting the deterioration degree in a temporal low usage state, which may not be intended by the user. In the case, the detection has to be stopped immediately, or the rechargeable battery B may be in an unstable state due to a large change in load. By determining that the rechargeable battery B is in the low usage state after confirming that the low usage state continues for a certain period of time, the electronic device 1 can increase the probability that the deterioration detection ends properly and can obtain accurate detection results.

Further, the first controller 31 as the detection unit starts detecting the degree of decrease in the output voltage in response to predicting that the determined low usage state continues for a reference time or longer. Measuring the voltage decrease due to the self-discharge takes a certain period of time (e.g., an hour basis). When the low usage state ends in a short time, the voltage decrease cannot be measured accurately. The electronic device 1 starts measuring the voltage decrease only when the low usage state is quite likely to continue for a enough period of time or longer for measuring the voltage decrease, on the basis of time zones, conditions in normal use, and so forth. This can reduce unnecessary operations.

Further, the operation performer 60 includes the second controller 61 and the third controller 62 that consumes less power than the second controller 61. The first controller 31 as the detection unit determines that the rechargeable battery B is in the low usage state when the second controller 61 is inactive. In the electronic device 1 that includes several controllers that consume different amounts of power depending on the operation state, switching on/off of these controllers indicates whether the electronic device 1 is actively used. The electronic device 1 can easily determine whether the rechargeable battery B is in the low use state without performing a separate substantial determination process. Further, when the second controller 61 that consumes a large amount of power is inactive, the rechargeable battery B can be in a more stable low usage state.

Further, the third controller 62 controls keeping of current time. The power consumption by the operation of the third controller 62 is small and substantially stable at low levels. Accordingly, the other factors that influence self-discharge can be easily taken into account. This allows the electronic device 1 to more easily and accurately measure/calculate the voltage decrease rate due to self-discharge.

Further, the first controller 31 as the detection unit may stop detecting the deterioration degree of the rechargeable battery B when the low usage state ends during the detection of the degree of decrease. As deterioration of the rechargeable battery B does not proceed rapidly, a few times of failure in detecting deterioration may not be a problem. The first controller 31 does not have to obtain the detection result that is less accurate than the normal detection result or do not have to do the detection over and again. This enables easy detection process.

When the low usage state ends during detection of the degree of decrease in output voltage, the first controller 31 as the detection unit may detect the deterioration state of the rechargeable battery B on the basis of the degree of decrease until the end of the low usage state. One time of detection takes a certain period of time. If a certain level of accuracy can be attained in the detection result, the electronic device 1 may perform detection of the deterioration state at a certain level of accuracy/reference different from the accuracy/reference in the normal detection. This allows the electronic device 1 to detect the deterioration degree of the rechargeable battery B at a certain level of accuracy and frequency, even when the electronic device 1 is used with hardly any low usage state. Accordingly, the user can deal with the deterioration by, for example, replacing the rechargeable battery B as necessary without a long delay.

Further, the first controller 31 as the detection unit may change the reference(s) for detecting the deterioration state of the rechargeable battery B according to the state of the electronic device 1 (e.g., environmental factors, such as temperature and presence of a resident application program). The electronic device 1 detects self-discharge of the rechargeable battery B in certain situations when the rechargeable battery B is supplying a small amount of power. When the power supply by the rechargeable battery B has some characteristics or the characteristics of self-discharge of the rechargeable battery B change, the electronic device 1 can change the reference(s) for detection according to these characteristics and changes. Accordingly, the electronic device 1 can more accurately evaluate the amount of voltage decrease (voltage decrease rate) due to self-discharge.

The electronic device 1 further includes the measurer 67 capable of measuring temperature. The first controller 31 as the detection unit determines the reference for detection on the basis of the temperature measured by the measurer 67. In general, temperature affects output of the rechargeable battery B. By changing the reference for detection according to temperature, the electronic device 1 can appropriately evaluate the voltage decrease due to self-discharge and can detect the deterioration degree of the rechargeable battery B at higher accuracy.

Further, the rechargeable battery B is a lithium ion battery. A major problem of the lithium ion battery is its expansibility. By appropriately evaluating the deterioration degree of the battery on the basis of the voltage decrease due to self-discharge, the electronic device 1 can effectively avoid troubles.

Further, the method for detecting deterioration of the rechargeable battery in this embodiment includes: determining whether the rechargeable battery B is in a low usage state with regard to power supply by the rechargeable battery; determining a degree of decrease in the output voltage over a period of time during which the rechargeable battery B is determined to be in the low usage state, based on the information obtained by the voltage measurer 40; and detecting a deterioration state of the rechargeable battery B, based on the determined degree of decrease.

According to the method, the deterioration state of the rechargeable battery B can be detected while keeping the rechargeable battery B capable of supplying power to the electronic device 1. This allows the user to deal with deterioration of the rechargeable battery B by, for example, replacing the rechargeable battery B before the performance of the rechargeable battery B decreases considerably or before any trouble occurs.

Further, by executing the program 32, the controller (normal processor) can easily detect the deterioration degree of the rechargeable battery B through software without interrupting the use of the electronic device 1. This can eliminate the need of a specific configuration in the electronic device 1 and restrain increase in cost, size, and production work. This also allows the electronic device 1 to appropriately notify the need of replacing the rechargeable battery B to the user before malfunction occurs.

The present invention is not limited to the above embodiment and can be variously modified.

For example, in the above-described embodiment, the low usage state refers to (i) a state in which the electronic device 1 is connected to the external power supply and the rechargeable battery B is not on charge and (ii) a state in which the second controller 61 is inactive. However, the low usage state is not limited to these states. Alternatively, only one of these states may be considered as the low usage state.

Further, the voltage measurer 40 may not be a measurer that measures voltage itself. The voltage measurer 40 may be a measurer that measures such a physical quantity other than voltage that changes according to the voltage or the voltage decrease width from a set timing (measurer that measures a physical quantity relating to the output voltage). In the case, data of the physical quantity may be retained such that the microcomputer 30 can convert the data into voltages or voltage decrease widths.

Further, in the above embodiment, the electronic device 1 normally measures the voltage decrease width over the fixed required time dT or measures the time required for the voltage to decrease by the fixed voltage decrease width dV. However, this does not limit the present invention. The required time dT and the voltage decrease width dV may be changed according to the situation. Further, the measuring time may be appropriately adjusted according to the duration of the low usage state.

Further, in the above embodiment, only the voltage difference between the start and end of the measurement is taken into account. Instead, the deterioration degree of the rechargeable battery B may be detected by (i) dividing the measuring time into multiple time sections, (ii) measuring a voltage decrease rate in each time section, and (iii) obtaining statistical representative values (e.g., average values) of the measured voltage decrease rates.

Further, in the above embodiment, the third controller 62 keeps and displays current time as a continuous low-power-consuming operation in the clock operation mode. However, the operation by the third controller 62 is not limited to this. For example, the third controller 62 may not control display of current time, or more specifically, may not cause the display 64 to display current time to save power. Further, the continuous low-power-consuming operation may be performed by a device that detects abnormal measurement results of the measurer 67.

Further, in the above embodiment, in the power-saving mode, the third controller 62 controls operation of the electronic device 1 while the second controller 61 is inactive. However, the electronic device 1 may not have the third controller 62 and may stop its normal operation when the operation performer 60 stops operating. In the case, the charge control IC 20 and the microcomputer 30 may keep operating as necessary. Such an electronic device 1 may detect deterioration of the rechargeable battery B under the control of the microcomputer 30 when the operation performer 60 is inactive. In deactivating the microcomputer 30, the electronic device 1 may start detecting deterioration of the rechargeable battery B and record the voltage and date and time immediately before it stops operation (shutdown). When rebooted, the electronic device 1 may record the voltage and the date and time again and calculate differences in voltage and date and time to obtain the voltage decrease rate.

Further, the detailed configuration of the operation performer 60 in the above embodiment is an example, and the operation performer 60 may perform any other operation. Further, the electronic device 1 is not limited to a portable terminal wearable on the body (arm). The electronic device 1 may be wearable on other parts of the body or may not be wearable on the body.

Further, in the above embodiment, when the low usage state ends during deterioration detection and the output voltage has already decreased by the reference decrease width or more in the interrupted detection, the electronic device 1 determines that deterioration of the rechargeable battery B is large regardless of the measuring time. However, such an exception may not be set. The electronic device 1 may stop deterioration detection without exception when the low usage state ends, regardless of measuring time. Further, when the detection is interrupted, the electronic device 1 may not wait for the next low usage state and may end the deterioration detection control process of the day.

Further, in the above embodiment, examples of the state of the electronic device 1 for setting references in detecting the deterioration degree include connection to the external power supply, temperature; and the operation state of an application program. These example, however, do not limit the present invention. Not only temperature but also changes in temperature may be considered for setting references. The temperature of the electronic device 1 may decrease right after charging or stop of operation of the second controller 61. Such temperature decrease may be taken into account in detecting the deterioration degree of the rechargeable battery B on the basis of the voltage decrease rate. In another example, the electronic device 1 may start detecting the deterioration degree of the rechargeable battery B only when temperature changes are small and stable.

Further, in the above embodiment, the references for detecting the deterioration degree are determined in consideration of the temperature measured by the measurer 67 in the electronic device 1. The surrounding temperature may be, however, obtained by the second controller 61 via the communicator 66. In the case, the second controller 61 may send the temperature information to the microcomputer 30 right before the second controller 61 stops operation so that the first controller 31 can utilize the temperature information.

Further, in the above embodiment, the rechargeable battery B is a lithium ion battery. The rechargeable battery may be, however, any other type of rechargeable battery the self-discharge of which increases.

Further, the components and contents of the two different deterioration detection control processes described above can be combined as desired without contradicting each other.

Further, in the above description, a nonvolatile memory, such as a flash memory, and a ROM are described as examples of a computer readable medium storing the program 32 for controlling detection of the deterioration degree of the rechargeable battery B in the present invention. However, the computer readable medium is not limited to these. As other computer readable media, other types of nonvolatile memory, such as a magneto-resistive random access memory (MRAM), and a portable recording medium, such as a CD-ROM or a DVD, may be used. Further, as a medium to provide data of the programs of the present invention via a communication line, a carrier wave may be used.

The detailed configurations, contents and orders of the steps in the processes, and so forth shown in the above embodiment can be appropriately modified without departing from the scope of the present invention.

Although some embodiments of the present invention have been described, the scope of the present invention is not limited to the embodiment described above but encompasses the scope of the invention recited in the claims and the equivalent thereof.

What is claimed is:

1. An electronic device comprising:
   a first processor;
   a load that operates with power supplied by a rechargeable battery; and
   a first sensor that obtains information on an output voltage of the rechargeable battery,
   wherein the first processor:
      determines whether the rechargeable battery is in a low usage state with regard to power supply by the rechargeable battery;
      based on the information obtained by the first sensor, determines a degree of decrease in the output voltage over a period of time during which the rechargeable battery is determined to be in the low usage state; and
      based on the determined degree of decrease, detects a deterioration of the rechargeable battery, and
   wherein
      the load includes a second processor and a third processor that consumes less power than the second processor, and
      in a case where the second processor is inactive, the first processor determines that the rechargeable battery is in the low usage state.

2. The electronic device according to claim 1, further comprising a power supply circuit that electrically connects the rechargeable battery to the load, wherein
   the first processor controls charging of the rechargeable battery when the power supply circuit is connected to an external power supply, the first processor sends power supplied by the external power supply to the load while the power supply circuit is connected to the external power supply, and in a case where the rechargeable battery is not on charge and the load is operating with the power supplied by the external power supply, the first processor determines that the rechargeable battery is in the low usage state.

3. The electronic device according to claim 2, wherein the first processor starts detecting the degree of decrease in the output voltage when the power supply circuit is kept connected to the external power supply after the rechargeable battery is fully charged by the external power supply connected to the power supply circuit.

4. The electronic device according to claim 2, wherein the first processor starts detecting the degree of decrease in the output voltage of the rechargeable battery when the output voltage reaches a predetermined level in the low usage state.

5. The electronic device according to claim 3, wherein the first processor starts detecting the degree of decrease in the output voltage of the rechargeable battery when the output voltage reaches a predetermined level in the low usage state.

6. The electronic device according to claim 1, wherein the first processor detects the degree of decrease in the output voltage, based on an amount of decrease of the output voltage until a set time elapses or a time that elapses until the output voltage decreases by a certain amount.

7. The electronic device according to claim 1, wherein in a case where a set time elapses after consumption of power of the rechargeable battery by the load becomes equal to or less than a reference level, the first processor determines that the rechargeable battery is in the low usage state.

8. The electronic device according to claim 1, wherein the first processor starts detecting the degree of decrease in the output voltage in predicting that the low usage state continues for a reference time or longer.

9. The electronic device according to claim 1, wherein the third processor controls keeping of current time.

10. The electronic device according to claim 1, wherein the first processor stops detecting the degree of decrease in the output voltage in a case where the low usage state ends during the detection of the degree of decrease.

11. The electronic device according to claim 1, wherein in a case where the low usage state ends during detection of the degree of decrease in the output voltage, the first processor detects the deterioration of the rechargeable battery based on the degree of decrease until an end of the low usage state.

12. The electronic device according to claim 1, wherein the first processor changes a reference for detecting the deterioration of the rechargeable battery according to a state of the electronic device.

13. The electronic device according to claim 12, further comprising a second sensor that obtains information on temperature, wherein
the first processor determines the reference based on the information obtained by the second sensor.

14. The electronic device according to claim 1, wherein the rechargeable battery is a lithium-ion battery.

15. A method for detecting deterioration of a rechargeable battery of an electronic device that includes: a load that operates with power supplied by the rechargeable battery; and a first sensor that obtains information on an output voltage of the rechargeable battery, the method comprising performing by a first processor:
determining whether the rechargeable battery is in a low usage state with regard to power supply by the rechargeable battery;
based on the information obtained by the first sensor, determining a degree of decrease in the output voltage over a period of time during which the rechargeable battery is determined to be in the low usage state; and
based on the determined degree of decrease, detecting a deterioration of the rechargeable battery,
wherein
the load includes a second processor and a third processor that consumes less power than the second processor, and
the method comprises the first processor performing, in a case where the second processor is inactive, determining that the rechargeable battery is in the low usage state.

16. A non-transitory computer-readable storage medium storing a program for a first processor of an electronic device that includes: a load that operates with power supplied by a rechargeable battery; and a first sensor that obtains information on an output voltage of the rechargeable battery, the program causing the first processor to:
determine whether the rechargeable battery is in a low usage state with regard to power supply by the rechargeable battery;
based on the information obtained by the first sensor, determine a degree of decrease in the output voltage over a period of time during which the rechargeable battery is determined to be in the low usage state; and
based on the determined degree of decrease, detect a deterioration of the rechargeable battery, and
wherein
the load includes a second processor and a third processor that consumes less power than the second processor, and
in a case where the second processor is inactive, the program causes the first processor to determine that the rechargeable battery is in the low usage state.

17. An electronic device comprising:
a first processor;
a load that operates with power supplied by a rechargeable battery;
a first sensor that obtains information on an output voltage of the rechargeable battery; and
a power supply circuit that electrically connects the rechargeable battery to the load,
wherein the first processor:
determines whether the rechargeable battery is in a low usage state with regard to power supply by the rechargeable battery;
based on the information obtained by the first sensor, determines a degree of decrease in the output voltage over a period of time during which the rechargeable battery is determined to be in the low usage state; and
based on the determined degree of decrease, detects a deterioration of the rechargeable battery,
wherein
the first processor controls charging of the rechargeable battery when the power supply circuit is connected to an external power supply,
the first processor sends power supplied by the external power supply to the load while the power supply circuit is connected to the external power supply, and in a case where the rechargeable battery is not on charge and the load is operating with the power supplied by the external power supply, the first processor determines that the rechargeable battery is in the low usage state.

* * * * *